United States Patent
Su et al.

(10) Patent No.: US 11,335,826 B2
(45) Date of Patent: May 17, 2022

(54) SEMICONDUCTOR PHOTO-DETECTING DEVICE

(71) Applicant: EPISTAR CORPORATION, Hsinchu (TW)

(72) Inventors: Chu-Jih Su, Hsinchu (TW); Chao-Shun Huang, Hsinchu (TW); Shiuan-Leh Lin, Hsinchu (TW); Shih-Chang Lee, Hsinchu (TW); Wen-Luh Liao, Hsinchu (TW); Mei-Chun Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/917,223

(22) Filed: Jun. 30, 2020

(65) Prior Publication Data

US 2021/0408310 A1    Dec. 30, 2021

(51) Int. Cl.
*H01L 31/055* (2014.01)
*H01L 25/16* (2006.01)
*H01L 31/0224* (2006.01)
*H01L 31/0304* (2006.01)
*H01L 31/12* (2006.01)
*H01L 31/101* (2006.01)

(52) U.S. Cl.
CPC ......... *H01L 31/055* (2013.01); *H01L 25/167* (2013.01); *H01L 31/022408* (2013.01); *H01L 31/03046* (2013.01); *H01L 31/101* (2013.01); *H01L 31/125* (2013.01)

(58) Field of Classification Search
None
See application file for complete search history.

(56) References Cited

U.S. PATENT DOCUMENTS

| | | | |
|---|---|---|---|
| 5,471,076 A | 11/1995 | Murakami et al. | |
| 5,880,489 A | 3/1999 | Funaba et al. | |
| 6,831,308 B2 * | 12/2004 | Ono | H01L 31/1035 257/184 |
| 7,538,403 B2 * | 5/2009 | Gao | H01L 31/105 257/431 |
| 2013/0207160 A1 * | 8/2013 | Sasahata | H01L 31/1844 257/186 |

FOREIGN PATENT DOCUMENTS

JP    2006032567 A    2/2006

* cited by examiner

*Primary Examiner* — Matthew L Reames
(74) *Attorney, Agent, or Firm* — Muncy, Geissler, Olds & Lowe, P.C.

(57) ABSTRACT

A photo-detecting device includes a substrate, a first semiconductor layer, a light-absorbing layer, a second semiconductor layer, a semiconductor contact layer, an insulating layer, and an electrode structure. The second semiconductor layer includes a first region and a second region. The semiconductor contact layer is on the first region. The insulating layer covers the semiconductor contact layer, the first region, and the second region. The electrode structure covers the semiconductor contact layer, the insulating layer, the first region, and the second region.

20 Claims, 2 Drawing Sheets

SEMICONDUCTOR PHOTO-DETECTING DEVICE

FIELD OF DISCLOSURE

The present disclosure relates to a semiconductor photo-detecting device, and particularly to a semiconductor photo-detecting device having a semiconductor contact layer.

BACKGROUND OF THE DISCLOSURE

The descriptions herein merely provide background information related to the present disclosure and do not necessarily constitute prior arts. A semiconductor optoelectronic device mainly involves the conversion between the light and electricity. A light-emitting device, such as a light-emitting diode (LED) or a laser diode (LD), can convert electricity to light, and a light-absorbing device, such as a photovoltaic cell (PVC) or a photo-detecting device (PD), can convert light to electricity. LEDs have been widely applied to illumination and light sources of various electronic devices, and LDs have also been applied to projectors and proximity sensors extensively. PVCs can be applied to power plants and power generation centers for use in space and PDs can be applied to fields of light sensing and communication.

SUMMARY OF THE DISCLOSURE

The present disclosure provides a photo-detecting device. The photo-detecting device includes a substrate, a first semiconductor layer, a second semiconductor layer, a light-absorbing layer, a semiconductor contact layer, an insulating layer, and an electrode structure. The first semiconductor layer is located on the substrate and includes a first dopant. The second semiconductor layer is located on the first semiconductor layer and includes a first region and a second region. The first region includes a second dopant and a third dopant. The second region includes the second dopant and does not comprise the third dopant. The light-absorbing layer is located between the first semiconductor layer and the second semiconductor layer. The semiconductor contact layer is located on the first region. The insulating layer covers the semiconductor contact layer, the first region, and the second region. The electrode structure covers the semiconductor contact layer, the first region, and the second region.

The present disclosure further provides a photo-detecting module. The photo-detecting module includes a light-emitting device, the photo-detecting device, and a carrier electrically connecting to the light-emitting device and the photo-detecting device.

DETAILED DESCRIPTION OF THE DISCLOSURE

Figure 1:
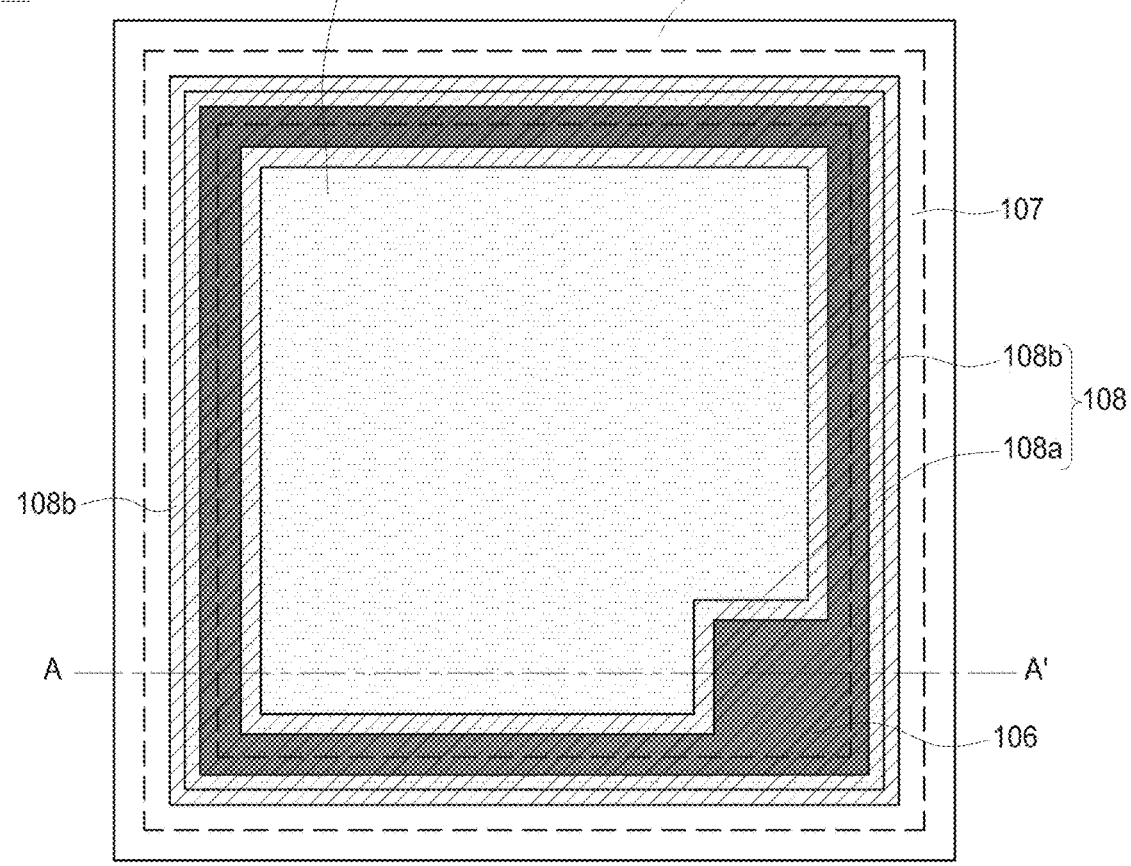
FIG. 1 shows a photo-detecting device in accordance with an embodiment of the present disclosure.
Figure 1:
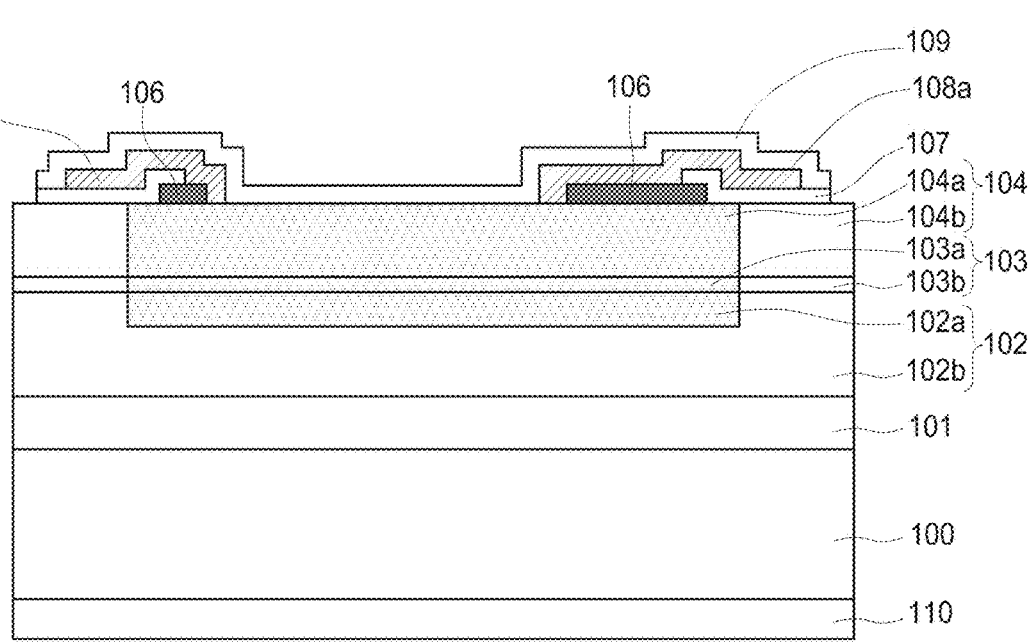

The embodiments of the present disclosure will be described in detail below with reference to the drawings. In the descriptions of the specification, specific details are provided for a full understanding of the present disclosure.

The same or similar elements in the drawings will be denoted by the same or similar symbols. It is noted that the drawings are for illustrative purposes only and do not represent the actual dimensions or quantities of the elements. Some of the details may not be fully sketched for the conciseness of the drawings.

FIG. 1 shows a photo-detecting device in accordance with an embodiment of the present disclosure wherein the upper part of FIG. 1 shows a top view of a photo-detecting device 10 and the lower part of FIG. 1 shows a cross-section view taken along cross-section line AA'. The photo-detecting device 10 includes a substrate 100, a first semiconductor layer 101, a second semiconductor layer 104, a light-absorbing layer 102, a semiconductor contact layer 106, an insulating layer 107, and an electrode structure 108. The first semiconductor layer 101 is located on the substrate 100. The second semiconductor layer 104 is located on the first semiconductor layer 101. The light-absorbing layer 102 is located between the first semiconductor layer 101 and the second semiconductor layer 104. The semiconductor contact layer 106 is located on the second semiconductor layer 104. The insulating layer 107 covers the semiconductor contact layer 106 and the second semiconductor layer 104. The first electrode structure 108 covers the semiconductor contact layer 106 and the second semiconductor layer 104. The first electrode structure 108 includes an electrode pad 108a.

The photo-detecting device 10 can further include an anti-reflection layer 109 located on the second semiconductor layer 104. The anti-reflection layer 109 can cover the first electrode structure 108 and the insulating layer 107. The insulating layer 107 has an opening exposing the electrode pad 108a. In the embodiment, the photo-detecting device 10 further includes a second electrode structure 110 located on the bottom of the substrate 100. Specifically, the substrate 100 has a first conductivity-type and includes a top surface. The first semiconductor layer 101 has the first conductivity-type and includes a first dopant. The second semiconductor layer 104 includes a first region 104a and a second region 104b. The first region 104a includes a second dopant and a third dopant. The third dopant may be different from the first dopant and the second dopant. In an embodiment, in the first region 104a, the doping concentration of the third dopant is higher than that of the second dopant, such that the first region 104a of the second semiconductor layer 104 substantially has a second conductivity-type. The first conductivity-type is opposite to the second conductivity-type. The second region 104b includes the second dopant but does not include the third dopant, such that the second region 104b of the second semiconductor layer 104 substantially has the first conductivity-type. In an embodiment, the first dopant, the second dopant or the third dopant may be magnesium (Mg), zinc (Zn), silicon (Si), or tellurium (Te). In a top view of the photo-detecting device 10, as shown in the upper part of FIG. 1, the second region 104b surrounds the first region 104a. In a cross-section view of the photo-detecting device 10, as shown in the lower part of FIG. 1, the first region 104a has a width smaller than a width of the second semiconductor layer 104. In a top view of the photo-detecting device 10, as shown in the upper part of FIG. 1, the first region 104a includes an exposed portion which is not covered by the semiconductor contact layer 106, the insulating layer 107, and the first electrode structure 108. In an embodiment, the exposed portion has a surface area which is 60% to 90% of a surface area of the first region 104a. The exposed portion of the first region 104a can be covered by and physically contact the anti-reflection layer 109. In the embodiment, a portion of the second region 104b is not covered by the semiconductor contact layer 106, the insulating layer 107, the first electrode structure 108 and the anti-reflection layer 109. In some embodiments, the uncovered portion of the second region 104b may benefit the progress of a subsequent fabrication process such as a dicing process. In an embodiment, the uncovered portion has a width of 10 μm or more.

The light-absorbing layer 102 is used to convert the energy of light into electricity and has a specific energy band gap (Eg1) corresponding to a specific wavelength (λ1). Therefore, the light-absorbing layer 102 is capable of absorbing the light having an energy band gap smaller than or equal to Eg1 or the light having a wavelength greater than or equal to λ1 and generating an electrical signal, such as current or voltage. The semiconductor contact layer 106 is located on the first region 104a of the second semiconductor layer 104. The semiconductor contact layer 106 includes the third dopant, such that the semiconductor contact layer 106 substantially has the second conductivity-type. The insulating layer 107 covers a portion of the semiconductor contact layer 106, the first region 104a and the second region 104b of the second semiconductor layer 104. Specifically, in a cross-section view of the photo-detecting device 10, the semiconductor contact layer 106 physically contacts the first region 104a and is separated from the second region 104b such that a current leakage path between the semiconductor contact layer 106 and the second region 104b can be prevented from being formed. In an embodiment, the semiconductor contact layer 106 is separated from the second region 104b by a distance of 5 μm or more. The first electrode structure 108 covers the semiconductor contact layer 106, the first region 104a and the second region 104b of the second semiconductor 104. In a cross-section view of the photo-detecting device 10, the semiconductor contact layer 106, the insulating layer 107, and the first electrode structure 108 are sequentially stacked along a vertical direction. In a cross-section view of the photo-detecting device 10, as shown in the lower part of FIG. 1, the first electrode structure 108, semiconductor contact layer 106, and the insulating layer 107 are sequentially and laterally disposed on the same plane along a horizontal direction. The semiconductor contact layer 106 includes a top surface, a first side surface, and a second side surface opposing to the first side surface. The first electrode structure 108 can physically contact a portion of the top surface and the first side surface, so that a low resistance interface (e.g. an ohmic contact) can be obtained between the semiconductor contact layer 106 and the first electrode structure 108. The insulating layer 107 can cover another portion of the top surface and the second side surface of the semiconductor contact layer 106. In the embodiment, the first electrode structure 108 includes an electrode pad 108a and an extension electrode 108b extending from the electrode pad 108a. The electrode pad 108a can connect to a power supply or other devices by an external wire. In an embodiment, the anti-reflection layer 109 has a hole on the electrode pad 108a so that the electrode pad 108a can physically connect to the external wire. A width of the extension electrode 108b is smaller than a width of the electrode pad 108a. In the top view of the photo-detecting device 10, as shown in the upper part of FIG. 1, the semiconductor contact layer 106 forms a first shape such as a rectangle along the perimeter of the first region 104a. The extension electrode 108b extends from the electrode pad 108a and forms a second shape such as a rectangle along the perimeter of the first region 104a. The insulating layer 107 forms a third shape such as a rectangle along the perimeter of the first region 104a. In an embodiment, the first shape, the second shape, and the third shape have substantially the same geometric center. In an embodiment, the first electrode structure 108 only covers an edge portion of the first region 104a in the top view of the photo-detecting device 10. For example, 50% to 90% of the surface area of the first region 104a is not covered by the electrode structure. In an embodiment, the edge portion of the first region 104a may be aligned with the first electrode structure 108 in a vertical direction so that the first electrode structure 108 has an outer profile having a width the same as a width of the first region 104a in a top view.

In an embodiment of the present disclosure, the photo-detecting device 10 further includes a diffusion barrier layer 103 between the second semiconductor layer 104 and the light-absorbing layer 102. The diffusion barrier layer 103 includes a third region 103a and a fourth region 103b. The third region 103a includes the second dopant and the third dopant. The doping concentration of the third dopant can be higher than that of the second dopant in the third region 103a, such that the third region 103a of the diffusion barrier layer 103 substantially has the second conductivity-type. The fourth region 103b includes the second dopant and does not include the third dopant, such that the fourth region 103b of the diffusion barrier layer 103 substantially has the first conductivity-type. In the top view of the photo-detecting device 10, as shown in the upper part of FIG. 1, the fourth region 103b surrounds the third region 103a. In a cross-section view of the photo-detecting device 10, as shown in the lower part of FIG. 1, a width of the third region 103a is smaller than a width of the diffusion barrier layer 103. In the top view of the photo-detecting device 10, as shown in the upper part of FIG. 1, the third region 103a includes an exposed portion which is not covered by the semiconductor contact layer 106, the insulating layer 107, and the first electrode structure 108. In an embodiment, the exposed portion has a surface area which is 60% to 90% of a surface area of the third region 103a. The diffusion barrier layer 103 is used to control the diffusion of the third dopant during the fabrication process of the photo-detecting device 10. For example, the concentration or spreading depth of the third dopant in the light-absorbing layer 102 may be adjusted by presence of the diffusion barrier layer 103. In an embodiment, the diffusion rate of the third dopant in the diffusion barrier layer 103 is slower than that in the light-absorbing layer 102. Furthermore, the diffusion rate of the third dopant in the diffusion barrier layer 103 is slower than that in the second semiconductor layer 104.

The light-absorbing layer 102 includes a fifth region 102a and a sixth region 102b. In the embodiment, the light-absorbing layer 102 includes the third dopant. The fifth region 102a includes the third dopant such that the fifth region 102a substantially has the second conductivity-type. The sixth region 102b can be undoped or unintentionally-doped. In the top view of the photo-detecting device 10, as shown in the upper part of FIG. 1, the sixth region 102b surrounds the fifth region 102a. In a cross-section view of the photo-detecting device 10, as shown in the lower part of FIG. 1, a width of the fifth region 102a is smaller than a width of light-absorbing layer 102. In the top view of the photo-detecting device 10, as shown in the upper part of FIG. 1, the fifth region 102a includes an exposed portion which is not covered by the semiconductor contact layer 106, the insulating layer 107, and the first electrode structure 108. In an embodiment, the exposed portion has a surface area which is 60% to 90% of a surface area of the fifth region 102a. In an embodiment, in the top view of the photo-detecting device 10, as shown in the upper part of FIG. 1, the first region 104a of the second semiconductor layer 104, the third region 103a of the diffusion barrier layer 103, and the fifth region 102a of the light-absorbing layer 102 occupy substantially the same area. That is, the first region 104a, the third region 103a and the fifth region 102a can be completely overlapped in a vertical direction. In a cross-section view of the photo-detecting device 10, as shown in the lower part of FIG. 1, the thickness of the first region 104a is equal to that of the second semiconductor layer 104, the thickness of the third region 103a is equal to that of the diffusion barrier layer 103, and the thickness of the fifth region 102a is thinner than that of the light-absorbing layer 102. The thickness of the fifth region 102a of the light-absorbing layer 102 may be larger than or equal to 800 nm, and may be smaller than or equal to 1500 nm, for example, about 850 nm, 900 nm, 950 nm, 1000 nm, 1050 nm, 1100 nm, 1150 nm, 1200 nm, 1250 nm, 1300 nm, 1350 nm, 1400 nm, or 1450 nm. By the presence of the fifth region 102a of the light-absorbing layer 102, the current generated by the light-absorbing layer 102 majorly flows through the fifth region 102a and the third region 103a, and an ineffective current path (for example, through the fourth region 103b of the diffusion barrier layer 103) can be prevented.

In an embodiment, the substrate 100 is an epitaxial substrate which can be used to grow the first semiconductor layer 101, the light-absorbing layer 102, the diffusion barrier layer 103, the second semiconductor layer 104, and/or the semiconductor contact layer 106 by metal organic chemical vapor deposition (MOCVD) method. In an embodiment, the substrate 100, the first semiconductor layer 101, the light-absorbing layer 102, the diffusion barrier layer 103, the second semiconductor layer 104, and the semiconductor contact layer 106 are lattice-matched to each other, wherein "lattice-matched" refers to the ratio of the difference between the lattice constants of two neighboring layers to the average of the lattice constants of two neighboring layers is smaller than or equal to 0.1%. In an embodiment, the substrate 100, the first semiconductor 101, the light-absorbing layer 102, the diffusion barrier layer 103, the second semiconductor layer 104, and the semiconductor contact layer 106 all include III-V compound semiconductors such as AlInGaAs series and/or AlGaInP series. AlInGaAs represents for $(Al_{x1}In_{(1-x1)})_{1-x2}Ga_{x2}As$, wherein $0 \leq x_1 \leq 1$ and $0 \leq x_2 \leq 1$, and AlInGaP represents for $(Al_{y1}In_{(1-y1)})_{1-y2}Ga_{y2}P$, wherein $0 \leq y_1 \leq 1$ and $0 \leq y_2 \leq 1$. In an embodiment, the substrate 100, the first semiconductor layer 101, the light-absorbing layer 102, the diffusion barrier layer 103, the second semiconductor layer 104, or the semiconductor contact layer 106 may include a binary or ternary III-V compound semiconductor. In an embodiment, the first conductivity-type is n-type and the second conductivity-type is p-type. In an embodiment, the first dopant and the second dopant both include Si, and the third dopant includes Zn. In an embodiment, the substrate 100 includes InP. In an embodiment, the first semiconductor layer 101 includes InP. In an embodiment, the fifth region 102a of the light-absorbing layer 102 includes $In_{0.53}Ga_{0.47}As$. In an embodiment, the sixth region 102b of the light-absorbing layer 102 includes $In_{0.53}Ga_{0.47}As$. In an embodiment, the first region 103a of the diffusion barrier layer 103 includes $In_{0.52}Al_{0.48}As$. In an embodiment, the fourth region 103b of the diffusion barrier layer 103 includes $In_{0.52}Al_{0.48}As$. In an embodiment, the first region 104a of the second semiconductor 104 includes InP. In an embodiment, the second region 104a of the second semiconductor 104 includes InP. In an embodiment, the semiconductor contact layer 106 includes $In_{0.53}Ga_{0.47}As$. The third dopant in the semiconductor contact layer 106 has a first doping concentration, the third dopant in the first region 104a of the second semiconductor 104 has a second doping concentration, the third dopant in the third region 103a of the diffusion layer 103 has a third doping concentration, and the third dopant in the fifth region 102a of the light-absorbing layer 102 has a fourth doping concentration. In an embodiment, the first, second, and third doping concentrations can be roughly the same, e.g. in a range of $10^{18}$ to $10^{19}$ cm$^{-3}$. The fourth doping concentration can be lower than any one of the first, second, and third doping concentrations, e.g. in a range of $10^{16}$ to $10^{18}$ cm$^{-3}$.

The first electrode structure 108 and the second electrode structure 110 can respectively include a single-layered or multilayered metal structure. The first electrode structure 108 and the second electrode structure 110 respectively include Ni, Ti, Pt, Pd, Ag, Au, Al, or Cu. The first electrode structure 108 and the second electrode structure 110 can be used as welding pads to connect to an external device or a circuit.

The insulating layer 107 and the antireflection layer 109 respectively include a dielectric material, such as tantalum oxide (TaO$_x$), aluminum oxide (AlOx), silicon oxide (SiOx), titanium oxide (TiOx), silicon nitride (SiNx), niobium oxide (Nb$_2$O$_5$) or spin-on-glass (SOG). In an embodiment, the antireflection layer 109 includes a multilayered structure with a gradient refractive index formed by different materials or compositions. For example, the refractive index decreases with the increase of the vertical distance between the antireflection layer 109 and the second semiconductor layer 104 to facilitate external light entering into the photo-detecting device 10.

Figure 2:
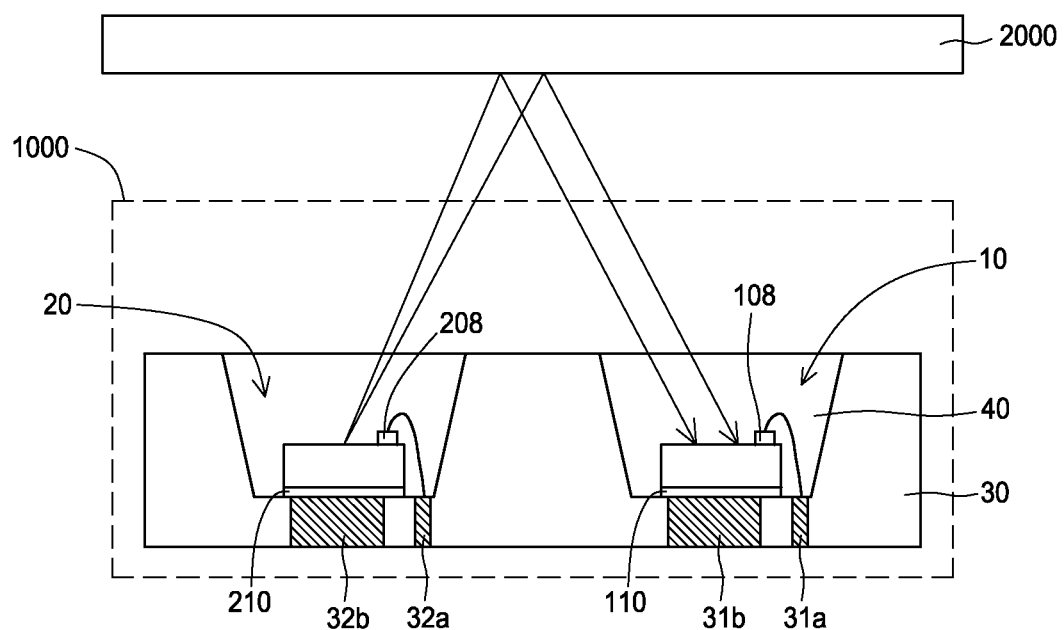
FIG. 2 shows a schematic view of a photo-detecting module and its application in accordance with an embodiment of the present disclosure.

FIG. 2 shows a photo-detecting module and the application thereof in accordance with the present disclosure. The photo-detecting module 1000 includes a carrier 30, a photo-detecting device 10 located in a first trench of the carrier 30, a light-emitting device 20 located in a second trench of the carrier 30, a transparent encapsulation structure 40 encapsulates the photo-detecting device 10 and the light-emitting device 20 which are in the trenches. The photo-detecting device 10 such as the photo-detecting device 10 in the aforementioned embodiments includes the electrode structures 108, 110. The light-emitting device 20 includes the electrode structures 208, 210, and further includes an active layer capable of emitting light e.g. infrared light with a peak wavelength in a range of 800 nm to 2000 nm (such as 810 nm, 850 nm, 910 nm, 940 nm, 1050 nm, 1070 nm, 1100 nm, 1200 nm, 1300 nm, 1400 nm, 1450 nm, 1500 nm, 1550 nm, 1600 nm, 1650 nm, or 1700 nm), to be absorbed by the photo-detecting device 10. The light-emitting device 20 and the photo-detecting device 10 can have the same material series, for example, the light-emitting device 20 and the photo-detecting device 10 both include AlInGaAs series or/and AlGaInP series. The carrier 30 includes first circuit structures 31a, 31b electrically connected to the electrode structures 108,110 of the photo-detecting device 10 respectively to receive electrical signals (such as current or voltage) generated by the photo-detecting device 10. The carrier 30 includes second circuit structures 32a, 32b electrically connected to the electrode structures 208, 210 of the light-emitting device 20 respectively to drive the light-emitting device 20 to emit the light with a specific wavelength, e.g. infrared light with a peak-wavelength in a range of 800 nm to 2000 nm. The photo-detecting module 1000 is used as a proximity sensor and can be applied in a mobile device. As shown in FIG. 2, when the mobile device including the photo-detecting module 1000 approaches an object 2000, the light with the specific wavelength emitted by the light-emitting device 20 is reflected by the object 2000 to the photo-detecting device 10 and further absorbed by the photo-detecting device 10, and an electrical signal is generated by the photo-detecting device 10 for sensing the existence of the object 2000 and triggering an action, e.g. turning on or off the screen of the mobile device accordingly. The carrier 30 can be a package submount or a printed circuit board (PCB). The electrode structures 108, 110, 208, 210, the first circuit structures 31a, 31b, and the second circuit structures 32a, 32b can respectively include a single-layered or multilayered structure and respectively comprise Ni, Ti, Pt, Pd, Ag, Au, Al or Cu. The transparent packaging structure 40 can include an organic polymer or inorganic dielectric material.

Based on the above, the photo-detecting device provided in the present disclosure may exhibit improved optical-electrical characteristics, such as low dark current (for example, <1 nA). Specifically, the semiconductor device of the present disclosure can be applied to products in various fields, such as lighting control, medical care, communication, or other sensing/detecting system. For example, the semiconductor device can be used in a mobile phone, tablet, wearable device (such as a watch, bracelet, or necklace) or medical device.

It should be realized that each of the embodiments mentioned in the present disclosure is only used for describing the present disclosure, but not for limiting the scope of the present disclosure. Any obvious modification or alteration is not departing from the spirit and scope of the present disclosure. Furthermore, the above-mentioned embodiments can be combined or substituted under the proper condition and are not limited to specific embodiments described above. A connection relationship between a specific component and another component specifically described in an embodiment may also be applied in another embodiment and is within the scope as claimed in the present disclosure.

What is claimed is:

1. A photo-detecting device comprising:
   a substrate;
   a first semiconductor layer located on the substrate and having a first dopant;
   a second semiconductor layer located on the first semiconductor layer and having a first region and a second region, wherein the first region comprises a second dopant and a third dopant and the second region comprises the second dopant and does not comprise the third dopant;
   a light-absorbing layer located between the first semiconductor layer and the second semiconductor layer;
   a semiconductor contact layer located on the first region and comprising a top surface, a first side surface, and a second side surface opposing to the first side surface, and the top surface comprises a first portion and a second portion;
   an insulating layer covering the semiconductor contact layer, the first region and the second region; and
   an electrode structure covering the first portion, the first side surface, the first region, and the second region.

2. The photo-detecting device of claim 1, wherein in a top view of the photo-detecting device, the first region contains a first exposed portion which is not covered by the semiconductor contact layer, the insulating layer, and the electrode structure.

3. The photo-detecting device of claim 2, wherein the first region has a first surface area, the first exposed portion has a second surface area, and the second surface area is 60% to 90% of the first surface area in the top view.

4. The photo-detecting device of claim 1, wherein in a cross-section view of the photo-detecting device, the first region has a first width, the second semiconductor layer has a second width larger than the first width.

5. The photo-detecting device of claim 1, wherein in a top view of the photo-detecting device, the second region surrounds the first region.

6. The photo-detecting device of claim 1, wherein in a cross-section view of the photo-detecting device, a part of the semiconductor contact layer, a part of the insulating layer, and a part of the electrode structure are sequentially stacked along a vertical direction.

7. The photo-detecting device of claim 1, wherein in a cross-section view of the photo-detecting device, the electrode structure, the semiconductor contact layer, and the insulating layer are sequentially disposed on a same plane along a horizontal direction.

8. The photo-detecting device of claim 1, wherein the insulating layer covers the second portion and the second side surface.

9. The photo-detecting device of claim 1, wherein the electrode structure comprises an electrode pad having a third width and an extension electrode extending from the electrode pad, wherein the extension electrode has a fourth width smaller than the third width.

10. The photo-detecting device of claim 1, wherein in a top view of the photo-detecting device, the semiconductor contact layer forms a first shape along a perimeter of the first region, the electrode structure forms a second shape along the perimeter of the first region, and the insulating layer forms a third shape along the perimeter of the first region.

11. The photo-detecting device of claim 10, wherein in the top view of the photo-detecting device, the first shape and the second shape have substantially a same geometric center.

12. The photo-detecting device of claim 10, wherein in the top view of the photo-detecting device, the first shape and the third shape have substantially a same geometric center.

13. The photo-detecting device of claim 1, wherein in a top view of the photo-detecting device, the first region has an edge portion, the first region has a first surface area, and the electrode structure only covers the edge portion, such that 50% to 90% of the first surface area is not covered by the electrode structure.

14. The photo-detecting device of claim 9, further comprising an antireflection layer covering the electrode structure and the insulating layer and having an opening exposing the electrode pad.

15. The photo-detecting device of claim 1, further comprising a diffusion barrier layer located between the second semiconductor layer and the light-absorbing layer.

16. The photo-detecting device of claim 1, wherein the first semiconductor layer, the second semiconductor layer, and the light-absorbing layer are lattice-matched.

17. The photo-detecting device of claim 1, wherein the first semiconductor layer and the second region of the second semiconductor layer are n-type semiconductor, the first region of the second semiconductor is p-type semiconductor.

18. A photo-detecting module, comprising:
    a light-emitting device;
    the photo-detecting device of claim 1; and
    a carrier electrically connecting to the light-emitting device and the photo-detecting device.

19. The photo-detecting device of claim 1, wherein in a top view of the photo-detecting device, the second region contains a second exposed portion which is not covered by the semiconductor contact layer, the insulating layer, and the electrode structure.

20. The photo-detecting device of claim 1, further comprising an antireflection layer covering the electrode structure, wherein the electrode structure has a portion located between the insulating layer and the antireflection layer.

\* \* \* \* \*